United States Patent [19]
Jenkins et al.

[11] 3,955,139
[45] May 4, 1976

[54] ZEROING CIRCUIT

[75] Inventors: Anthony Jenkins, Linton; Douglas Walter Isgrove, Cherryhinton, both of England

[73] Assignee: Analytical Instruments Limited, Royston, England

[22] Filed: July 15, 1974

[21] Appl. No.: 488,650

[30] Foreign Application Priority Data
July 13, 1973 United Kingdom............... 33433/73

[52] U.S. Cl............................. 324/130; 324/123 R
[51] Int. Cl.² ........................ G01R 1/02; G01R 1/30
[58] Field of Search ............ 324/130, 123 R, 103 P, 324/128, 102; 330/9; 328/132, 151

[56] References Cited
UNITED STATES PATENTS
3,815,020   6/1974   Kraft et al. ...................... 324/103 P OTHER PUBLICATIONS
*Keithley Instruments Catalog;* pp. 4, 5; Mar. 1955; Keithley Instruments, Cleveland, Ohio.

*Primary Examiner*—R. V. Rolinec
*Assistant Examiner*—Ernest F. Karlsen
*Attorney, Agent, or Firm*—Woodhams, Blanchard and Flynn

[57] ABSTRACT

Baseline drift and noise can produce difficulties in registering signals quantitatively without recourse to frequent rezeroing of the registering instrument. The invention provides a circuit in which the registering instrument only functions when a required signal is to be noted, the instrument at all other times being at a zero reading. The characteristics of a signal to be registered will be known. The circuit includes a differentiator which notes the rate of change of incoming signals and operates a switching device upon detecting a required rate of change to enable the signal to pass to the registering instrument. At all other times the registering instrument is isolated by the switching device. A comparator circuit can also be included to measure the magnitude of the signals which have the required rate of change as determined by the differentiator and to prevent the passage of signals to the registering instrument which fail to reach a predetermined magnitude, for example a magnitude of 10% of full scale deflection of the registering instrument.

9 Claims, 3 Drawing Figures

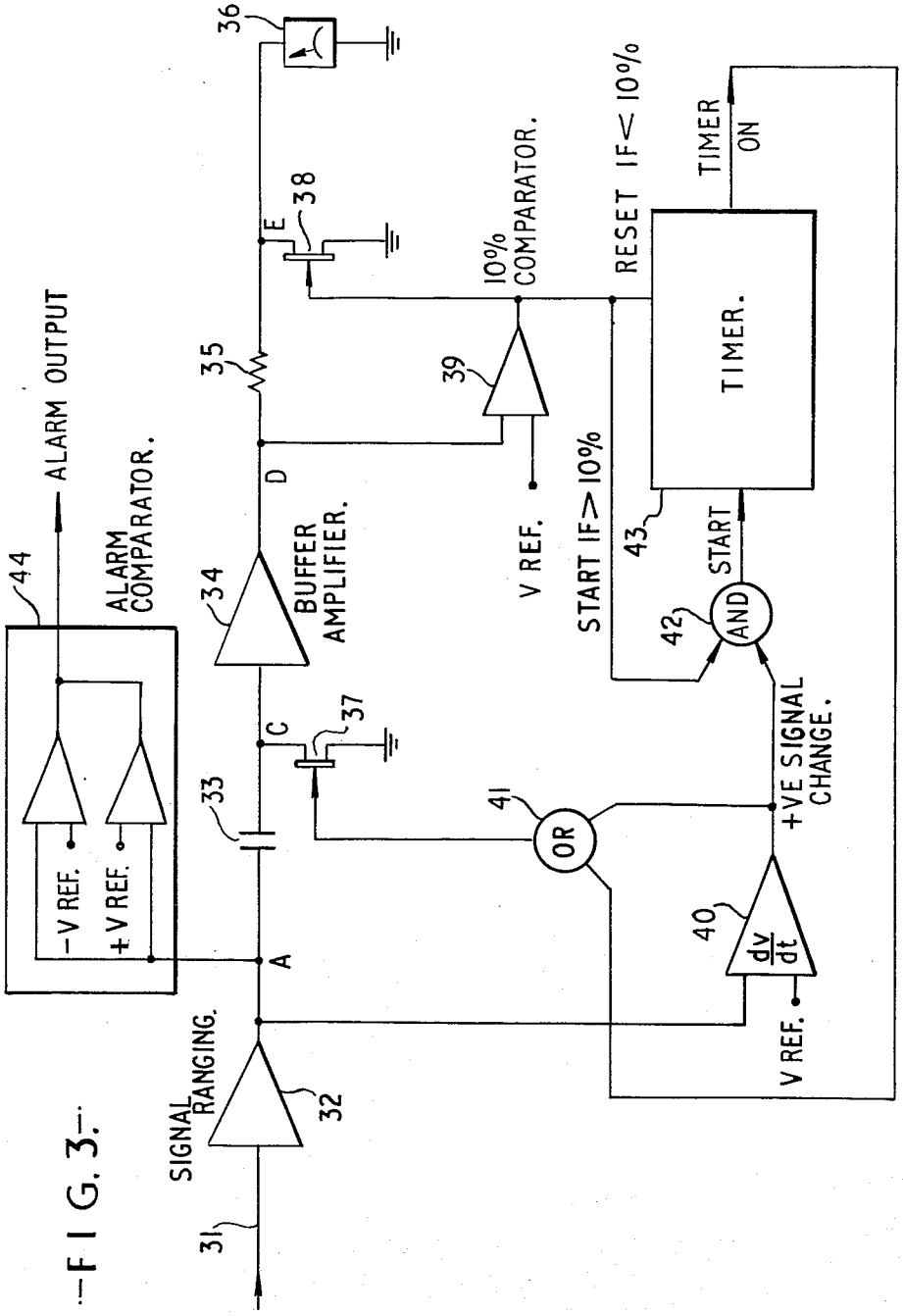

ZEROING CIRCUIT

The present invention concerns an automatic zeroing circuit, and in particular such a circuit for use in conjunction with leak detectors.

Leak detectors are employed to monitor and sample atmospheres for the presence of contaminants or leak products. As examples only mention can be made of the use of leak detectors in monitoring sealed pressurised containers, such as aerosol cans, detecting leaks in pressure gas lines and in detecting the vapours emitted by explosives compounds and drugs. An electron capture detector is an example of one form of leak detector but the present invention is not restricted to use with this particular form of leak detector and the automatic zeroing circuit to be described can be utilised with any form of apparatus, not necessarily leak detectors, which produce signals which tend to drift during use of the apparatus.

The signals to be detected will generally be superimposed on a shifting base or background resulting from drift and noise. Drift arises from a change with time of any function or characteristic of a circuit while noise is a background effect which is always present. Due to drift, signals move away from a theoretical base-like with time and it is desirable to eliminate both the effects of drift and noise at a meter or display instrument so as to obtain a quantitative representation of the signals.

According to one aspect of the present invention a zeroing circuit comprises a differentiator means for detecting the rate of change of an incoming signal and operable when said rate of change departs from a predetermined value to actuate a switching device for permitting the signal to be presented to a meter, the switching device being normally conditioned to isolate the meter from the incoming signal.

According to another aspect of the present invention a zeroing circuit comprises a first branch leading to a meter capable of registering voltage signals introduced into the branch and a second branch containing a differentiator means for determining the rate of change of the incoming signals and a timer, a switching device connected to said first branch and normally conditioned to isolate the meter from the incoming voltage signals and a comparator circuit connected to the first branch for determining the magnitude of the incoming voltage signals and operable to reset the timer when said magnitude falls below a predetermined value, the output of the differentiator means being applied through the timer to actuate the switching device for a preselected time interval when the rate of change of incoming signal exceeds a minimum value whereby to enable said incoming signal to proceed to the meter, the comparator determining the magnitude of said signals and resetting the timer to cause the switching device to revert to its normal condition if during said preselected time interval the magnitude of the incoming signals drops below a predetermined minimum value.

Conveniently, the first branch includes a capacitor and a zero or buffer amplifier, one side of the switching device being connected to the branch at a position intermediate the capacitor and the buffer amplifier with the other side of the switching device being maintained at earth potential, the switching device being in a normally closed condition.

Preferably, the circuit includes a second switching device connected to the first branch at a position immediately in front of the meter, and normally conditioned to isolate the meter from voltage signals in the branch, the second switching device being actuated by the comparator when the magnitude of the incoming voltage signals exceeds said predetermined minimum value to present the voltage signals at the meter.

The output of the differentiator means can be applied to one input of an OR gate and to one input of an AND gate, the output of the comparator can be applied to a second input of the AND gate and the output of the AND gate can be applied to the timer input, the timer output can be applied to a second input of the OR gate and the output of the OR gate can be applied to the first-mentioned switching device.

The invention will be described further, by way of example, with reference to the accompanying drawings; in which:

FIG. 3 is a schematic block diagram of a second embodiment of an automatic zeroing circuit.

Figure 1:
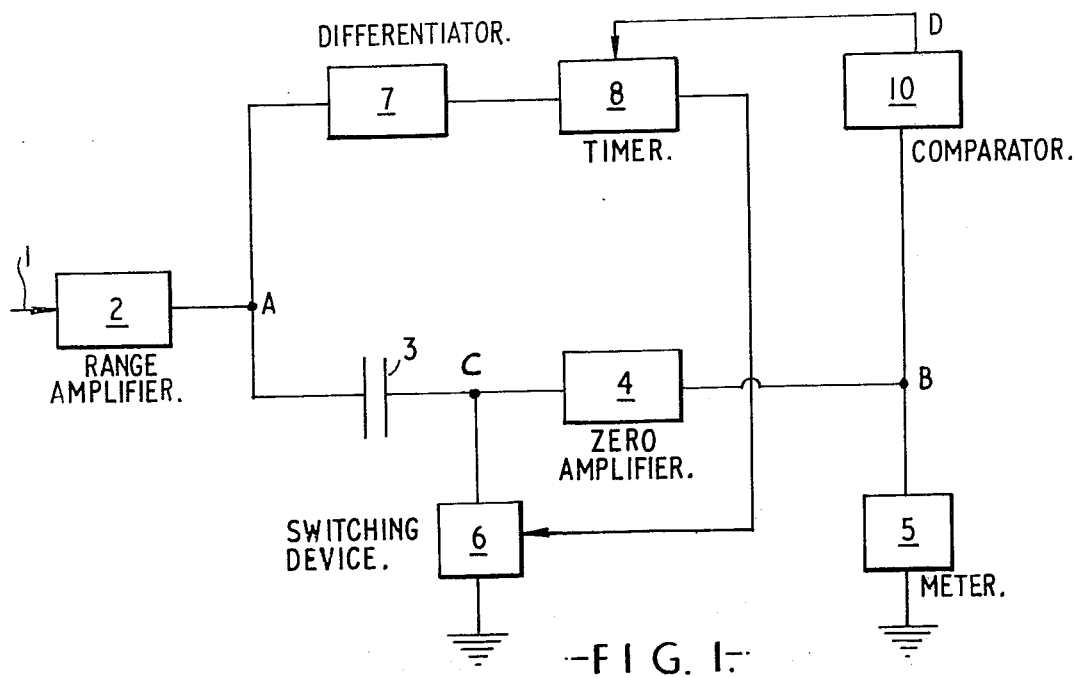
FIG. 1 is a schematic block diagram of an one embodiment of an automatic zeroing circuit.

With reference to FIG. 1 incoming signals, such as the signals emitted by a leak detector, for example an electron capture detector, enter the circuit at 1 and are first received in a range amplifier 2. The amplifier 2 is set to a required sensitivity prior to operation and is positioned to always give the same signal strength in the following zeroing circuit.

At junction A the circuit divides into two branches. The first branch includes a capacitor, or AC conducting and DC blocking element, 3 and a zero amplifier 4 in series connection with a meter 5. The kind and type of meter is a matter of choice, for example, the meter can give a visual display or an audible signal.

A switching device 6, for example a field effect transistor, is connected at C between the capacitor and the zero amplifier. The opposite side of the switching device is maintained at earth potential.

The second branch of the circuit includes a differentiator 7 in series connection with a timer 8. The timer 8 is coupled to the switching device.

The circuit so far mentioned functions in the following manner.

The incoming signals in the form of a voltage will comprise a peak or peaks given by the substance detected in the detector and which are superimposed on a shifting base or background resulting from drift and noise. Drift arises from a change with time of any function or characteristic of the circuit or a slow change of contamination level of a sampled atmosphere while noise is a background effect which is always present. Due to detector drift the signals move away from the original baseline with time and it is desirable to eliminate both the effects of drift and noise at the meter so as to obtain a quantitative representation of the signals.

The differentiator determines which signals are to be displayed at the meter and the differentiator functions by detecting the rate of change of the signals.

With reference to FIG. 1 assume that the switching device 6 is open, in other words, assume that the point C is not at earth potential. Ideally under such conditions any signal voltage at A will appear at B and will be displayed on the meter. On closing the switching device, to earth the point C, the signal voltage disappears from point B. Normally in use of the circuit and in the absence of a required signal voltage (which will be identified by the differentiator) the switching device is maintained in a closed condition so that any undesired signal voltages arriving at point A from the range amplifier are not registered on the meter as the point C is then at earth potential.

The differentiator detects a required signal voltage by the rate of change of the voltage and the differentiator is preset to switch on the timer at a certain slope level. This slope level will be known from the characteristics of the required signal. The differentiator is coupled to the switching device through the timer 8 and when it detects a signal voltage of the required slope it starts the timer which opens the normally closed switching device thereby enabling the required signal voltage at A to be presented at B and the meter.

The timer is preset and operates to close the switching device after a set time interval generally measured in seconds. The minimum time interval will be in the region of 1 seconds, the maximum can be about 2 minutes. Upon closing the switching device the meter 5 will revert to zero reading as the signal voltage at A will no longer be presented at B.

The circuit components, that is the differentiator, timer, zero amplifier and switching device, are all standard and known per se and as such a detailed description is not considered necessary.

Normally a signal response will be in the form of a peak which will decay back to the original base level within the period set on the timer. In the embodiment of FIG. 1 a comparator 10 will trigger timer off when the signal level falls back to within a few percent of the original base level. The comparator circuit, which compares the magnitude of the voltage signals arriving at point B with a known reference voltage, can be arranged to reset the timer at any desired level which can, for example, be 5%, 10% or 15% above the theoretical base-line of the zeroing circuit. Conveniently a 10% operating level is suitable for many applications.

Figure 2:
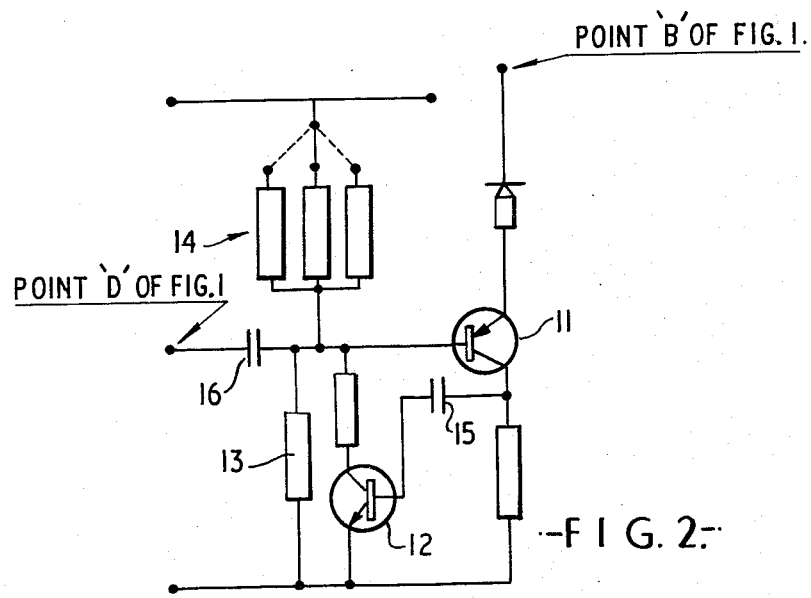
FIG. 2 is a detail of a comparator circuit forming a component of the circuit of FIG. 1.

The comparator circuit (FIG. 2) can comprise a potential divider in conjunction with a pair of junction triode transistors, one transistor 11 having an n-type base and the other transistor 12 having a p-type base. The potential divider comprises a first resistor 13 which can be arranged in series connections with any one of a group of second resistors 14 which determine the operating level of the comparator circuit. The group of second resistors can be chosen to give 5, 10 and 15% levels.

In operation, during the time that the output of the zero amplifier is zero, i.e. until a signal is recognised by the differentiator, the n-type base transistor will be turned "on" and the p-type base transistor will be turned "off". When a signal is recognised, the output of the zero amplifier will increase negatively and the n-type base transistor will be turned off with the p-type base transistor remaining unaffected. As the signal reduces back to zero a point will be reached when the n-type base transistor will again be turned on. This point will be determined by the potential divider which, for the sake of example, is set at the 10% level. As the n-type base transistor is turned on at this 10% level a positive voltage peak will pass across a capacitor 15 to turn on the p-type base transistor. This will cause a voltage to increase negatively and to pass across a second capacitor 16 to turn off the timer. As the first capacitor is charged the p-type base transistor will again turn off.

It is possible that spurious signals or noise will exhibit a rate of change which will actuate the differentiator. However the magnitude of such spurious signals will, in general, be small e.g. less than 10% of the scale of the meter. In the circuit of FIG. 1 small noise signals which cause the differentiator to turn the timer on and open the switch 6 will not pass through the threshold level of the comparator 10 and so the timer must run out before the base-line is again clamped on zero by closing the switch 6.

The spurious signals can be eliminated by allowing only the signals to be presented at the meter whose rate of change is greater than a preset value and whose magnitude is greater than the expected background noise. These conditions are provided by the arrangement shown in FIG. 3.

In FIG. 3, incoming signals, which can be signals emitted by a detector, enter the circuit along line 31 into a range amplifier 32. As before the amplifier 32 is set to a required sensitivity prior to operation and is arranged to give the same signal strength in the circuit.

At junction A the circuit divides into three branches. A first branch includes a capacitor, or AC conducting and DC blocking element, 33, a zero or buffer amplifier 34, a resistor 35 and a meter 36, all connected in series. As before, the type of meter selected can be a matter of choice. A second branch includes a differentiator 40 and a timer 43. A third branch includes an alarm comparator 44. This branch compares the voltage at A with both positive and negative reference voltages and the output is used as an indication of approaching saturation of the range amplifier 31.

One side of a first switching device 37, for example a field effect transistor, is connected to the first branch at position C intermediate the capacitor 33 and the buffer amplifier 34. The opposite side of the switching device 37 is earthed. Likewise one side of a similar second switching device 38 is connected to the first branch at position E intermediate the resistor 35 and the meter 36. Again the opposite side of this switching device 38 is maintained at earth potential. Both the switching devices 37 and 38 are normally in a closed condition, that is, with positions C and E at earth potential.

An input to a comparator 39 is taken from position D in the first branch intermediate the buffer amplifier 34 and the resistor 35. The comparator is provided with a known reference voltage. The comparator output is connected to the switching device 38, to an AND gate 42 in the second branch of the circuit between the differentiator 40 and the timer 43, and to a reset facility provided on the timer 43.

The outputs of both the differentiator 40 and the timer 43 are connected through an OR gate 41 to the first switching device 37.

The embodiment of FIG. 3 functions in the following manner.

Incoming signals on line 31 will comprise a voltage peak or peaks given, for example, by the substance detected in the detector and which are superimposed on a shifting base or background resulting from drift and noise. Due to drift the signals move away from an original baseline with time and it is desirable to eliminate the effects of both drift and noise at the meter in order to derive a quantitative representation of the signals.

The differentiator 40 and the comparator 39 together determine which signals are to be presented to the meter 36. The differentiator 40 determines the rate of change of signal $dv/dt$ while the comparator 39 determines the magnitude of the signal or signals which exceed a desired rate of change by comparison with a reference voltage.

If the incoming signals have a value which remains substantially constant with time the OR gate will not be actuated by the output from the differentiator 40 and consequently the switching device 37 will remain in its closed condition with position C in the first branch at earth potential. Switching device 38 also remains in its closed condition and hence no signals are presented to the meter 36.

Upon an increase in the incoming signal or signals the output of the differentiator also increases and when the rate of increase exceeds a predetermined value the OR gate 41 is actuated by the differentiator output to open the switching device 37. The characteristics of the signal or signals to be presented to the meter 36 will be known and the differentiator is preset to respond to such signals. Upon opening of the switching device 37 the position C is no longer at earth potential and the voltage signals appear at position D.

The comparator 39 is set to operate at a predetermined value of the magnitude of the signals received at position D. This value or level is arbitrary but conveniently, and for the sake of example, this can be 10% of the signal magnitude required to produce a full scale deflection at the meter 36. When the signal at D exceeds the reference voltage applied to the comparator 39, the comparator output causes the switching device 38 to open thereby removing earth potential from position E and allowing the signal to be presented to the meter 36. In addition the comparator output removes the reset on the timer 43 and operates the AND gate 42 to trigger the timer 43. Once triggered the timer 43 controls the first switching device 37 and the switching device 37 will remain open irrespective of any changes in the output of the differentiator. Upon completion of the timer period, the timer control on the OR gate is released and if the rate of signal change $dv/dt$ as determined by the differentiator has dropped below the initial required level the differentiator control on the OR gate is also released. Consequently the switching device 37 reverts to its closed condition thereby removing signals from the meter 36.

During the period that the timer 43 is in operation the signal at D may fall below the reference voltage of the comparator 39. In such a case the comparator output is unable to hold the switching device 38 in its open condition and the switching device 38 reverts to its closed condition at which position E is at earth potential. In this condition of the switching device 38 no signals can be presented to the meter 36. The drop in comparator output resets the timer 43 which in turn releases the timer control on the OR gate 41.

The alarm comparator 44 provides a warning when the incoming signal or signals approach the saturation level of the amplifier 32. The output of the comparator 44 can activate an alarm which can be audible or visual.

We claim:

1. A zeroing circuit comprising a signal path, an input connection to the path for receiving incoming signals, said signal path comprising a an AC conducting and DC blocking element and a meter in series connection therein, a normally closed switching device connected between ground and a position in the path intermediate the AC conducting and DC blocking element and the meter, a differentiator means for detecting a rate of change of incoming signals in said path and having input means connected to the signal path at a position intermediate the input connection and the AC conducting and DC blocking element, a timer means connecting the output of the differentiator means to said switching device and responsive to a differentiator means output when the rate of change of signal in the path exceeds a predetermined minimum for opening the switching device for a preset time interval and therewith allowing the signals in the signal path to proceed to the meter, said timer means including a reset input, a comparator circuit means having an input connected to the signal path at a position intermediate the switching device position and the meter and having an output coupled to the reset input of the timer means, the comparator circuit means being responsive to a signal magnitude on said signal path which is less than a predetermined magnitude for resetting the timer means to its initial condition, causing the switching device to close, and thereby isolating the meter from the incoming signals.

2. A zeroing circuit comprising a signal path, an input connection to the path for receiving incoming signals, said signal path comprising an AC conducting and DC blocking element and a meter in series connection therein, a first switching device connected between ground and a first position in the path intermediate the AC conducting and DC blocking element and the meter, a second switching device connected between ground and a second position in the path intermediate the AC conducting and DC blocking element and the meter, the first and second switching devices being normally closed to isolate the meter from signals in the path, a differentiator means having input means connected to the signal path at a position intermediate the input connection and the AC conducting and DC blocking element for detecting the rate of change of incoming signals, a comparator circuit means having input means connected to a third position in the path intermediate the first and second positions for detecting the magnitude of signals reaching said third position in the signal path, and a timer means having input means connected to outputs of said differentiator means and comparator circuit means and an output connected to said first switching means, said timer means being responsive to said differentiator means and said comparator circuit means for maintaining said first switching device open for a preset time interval in response to a signal in said path which exceeds both a minimum rate of change and a miniumum magnitude, means connecting the comparator circuit means output to said second switching device for opening the latter when said signals exceed said minimum magnitude and thereby allowing said signals to proceed to the meter, a reset facility on the timer responsive to falling of the comparator circuit means output below said minimum magnitude during said preset time interval for resetting the timer.

3. A zeroing circuit according to claim 2 including a buffer amplifier in the signal path intermediate said first and third positions and a resistance in said signal path intermediate said third and second positions.

4. A zeroing circuit according to claim 2 including an OR gate and an AND gate, the output of the differentiator means being coupled to one input of the OR gate and one input of the AND gate, the output of the comparator means being coupled to a second input of the AND gate and the output of the AND gate being coupled to the timer means, the timer means output being coupled to a second input of the OR gate, the output of the OR gate being coupled to the first switching device.

5. A zeroing circuit according to claim 2 in which said input connection includes a range amplifier for receiving incoming signals and means coupled thereto for initiating an alarm when said incoming signals at least approach levels which would saturate the range amplifier.

6. A zeroing circuit according to claim 5 in which said alarm initiating means include positive and negative reference voltage lines and further comparator means for comparing said incoming signals to said reference voltages.

7. A zeroing circuit according to claim 2 in which said AC conducting and DC blocking element comprises a capacitor.

8. A zeroing circuit according to claim 2 in which said switching devices comprises field effect transistors.

9. A zeroing circuit according to claim 1 in which said comparator circuit means includes voltage divider means for setting the voltage reference level of the comparator circuit means, a first transistor having a base coupled to said voltage divider means and switchable in response to dropping of the magnitude of an incoming signal peak to said reference level, a second transistor, means coupling the main current electrodes of said first transistor between the signal path adjacent said meter and the base of said second transistor for applying the signal peak to said first transistor and momentarily actuating said second transistor in response to said switching of said first transistor, and means coupling said second transistor to said timer means for resetting said timer means upon said momentary actuation of said second transistor.

* * * * *